(12) United States Patent
Kim et al.

(10) Patent No.: US 8,737,067 B1
(45) Date of Patent: May 27, 2014

(54) CONNECTIVITY SCHEME AND COOLING SCHEME FOR A LARGE RACK SYSTEM

(75) Inventors: Sean Kim, Saratoga, CA (US); Muhammad Sagarwala, Log Gatos, CA (US); Phu Truong, San Jose, CA (US)

(73) Assignee: Juniper Networks, Inc., Sunnyvale, CA (US)

( * ) Notice: Subject to any disclaimer, the term of this patent is extended or adjusted under 35 U.S.C. 154(b) by 469 days.

(21) Appl. No.: 13/078,693

(22) Filed: Apr. 1, 2011

(51) Int. Cl.
*H05K 7/20* (2006.01)

(52) U.S. Cl.
USPC ...... 361/690; 361/679.51; 361/721; 361/781; 361/788; 454/184; 342/175; 343/878

(58) Field of Classification Search
USPC ............ 361/676–678, 679.46–679.54, 361/688–722, 760, 781, 784, 788, 790
See application file for complete search history.

(56) References Cited

U.S. PATENT DOCUMENTS

| | | | | |
|---|---|---|---|---|
| 6,570,981 | B1* | 5/2003 | Weir et al. | 379/325 |
| 7,129,908 | B2* | 10/2006 | Edward et al. | 343/878 |
| 7,430,117 | B2* | 9/2008 | Shabany | 361/695 |
| 8,208,253 | B1* | 6/2012 | Goergen et al. | 361/679.5 |
| 2008/0055847 | A1* | 3/2008 | Belady et al. | 361/687 |
| 2008/0285248 | A1* | 11/2008 | Goergen | 361/788 |
| 2011/0045759 | A1* | 2/2011 | Rasmussen et al. | 454/184 |
| 2011/0222241 | A1* | 9/2011 | Shearman et al. | 361/692 |

* cited by examiner

*Primary Examiner* — Courtney Smith
(74) *Attorney, Agent, or Firm* — Harrity & Harrity, LLP

(57) ABSTRACT

A rack system may include a first plurality of line cards, where a particular one of the first plurality of line cards receives or sends packets via ports; a plurality of fabric cards, where a particular one of the plurality of fabric cards includes a switching fabric; a second plurality of line cards, where a particular one of the second plurality of line cards receives or sends packets via ports; a first backplane that connects the first plurality of line cards to the plurality of fabric cards; and a second backplane that connects the second plurality of line cards to the plurality of fabric cards.

18 Claims, 6 Drawing Sheets

US 8,737,067 B1

CONNECTIVITY SCHEME AND COOLING SCHEME FOR A LARGE RACK SYSTEM

BACKGROUND

The number of users of the Internet, the variety of services available on the Internet, and the number of devices communicating via the Internet all continue to increase. The rate of growth of Internet traffic may cause manufacturers of networking equipment to design systems with a larger number of components and with a greater number of interconnections. Networking equipment may include network cards comprising electrical components mounted on a circuit board. Multiple network cards may be mounted onto a chassis frame system. The chassis frame system may provide a space-efficient way to store and organize network cards, may provide EM shielding for the network cards, and may provide a mechanism that allows communication between individual network cards. The demand for systems with a larger number of components may lead to a need for large chassis frame systems that are able to accommodate a large number of network cards. The design of large chassis frame systems may present particular challenges.

SUMMARY OF THE INVENTION

According to one aspect, a rack system may include a first plurality of line cards, where a particular one of the first plurality of line cards receives or sends packets via ports; a plurality of fabric cards, where a particular one of the plurality of fabric cards includes a switching fabric; a second plurality of line cards, where a particular one of the second plurality of line cards receives or sends packets via ports; a first backplane that connects the first plurality of line cards to the plurality of fabric cards; and a second backplane that connects the second plurality of line cards to the plurality of fabric cards.

According to another aspect, a fabric card may include a printed circuit board that includes a switching fabric; a frame that includes a baffle, where the baffle divides air flow over the fabric card into a first air flow and a second air flow; and where the printed circuit board is mounted onto the frame.

According to yet another aspect, a method performed by a rack system, may include receiving a data unit by a first line card mounted in the rack system; forwarding the data unit to a fabric card via a first backplane; switching, by the fabric card, the data unit to a second line card via a second backplane, where the second backplane is different from the first backplane; and receiving the data unit by the second line card.

BRIEF DESCRIPTION OF THE DRAWINGS

The accompanying drawings, which are incorporated in and constitute a part of this specification, illustrate the invention and, together with the description, explain the invention. In the drawings.

DETAILED DESCRIPTION

Figure 1:
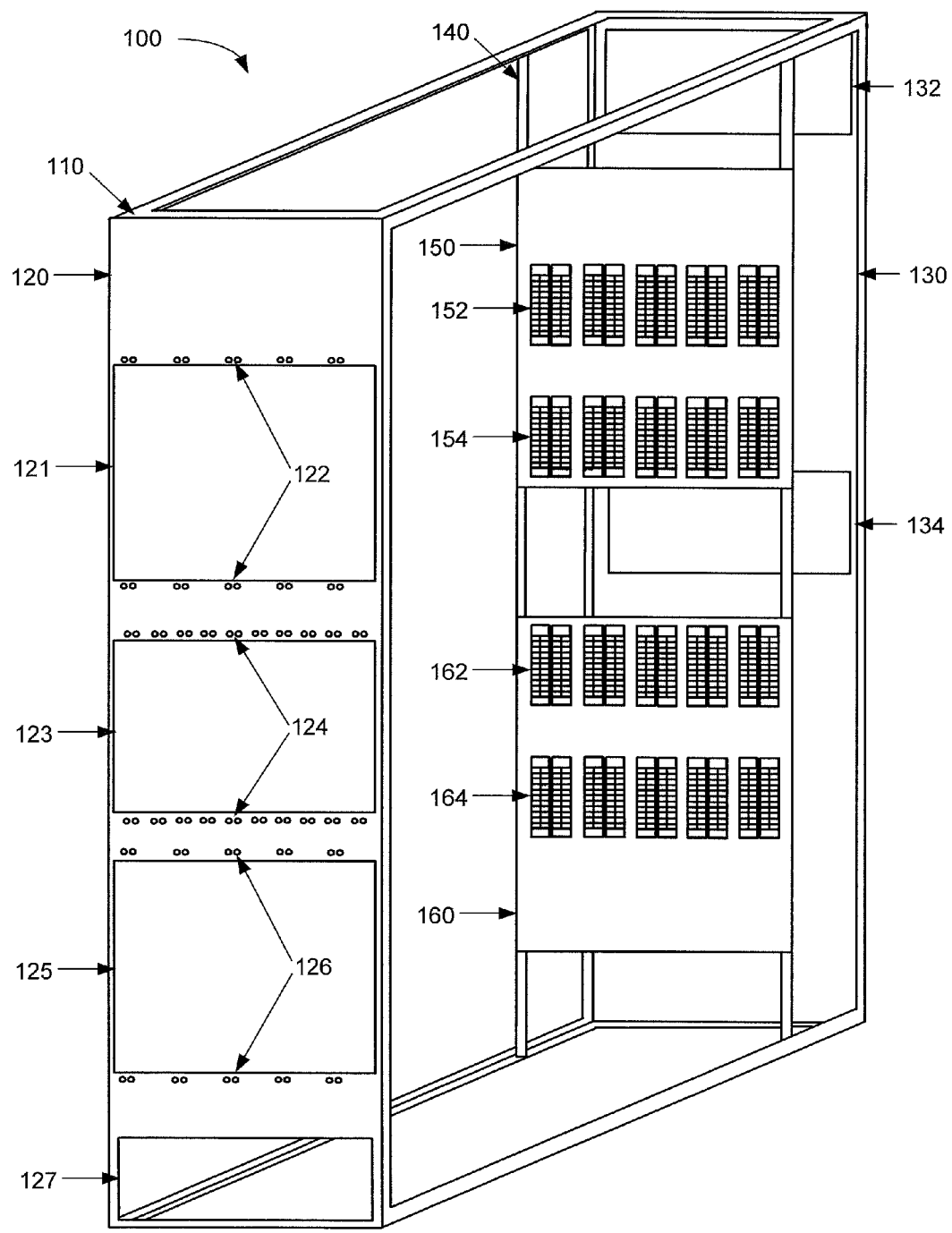
FIG. 1 is a diagram illustrating an example rack system according to an implementation described herein.

The following detailed description of the invention refers to the accompanying drawings. The same reference numbers may be used in different drawings to identify the same or similar elements. Also, the following detailed description does not limit the invention.

A rack system may include line cards and fabric cards that may communicate with each other via a back plane or a midplane. As rack systems increase in size, several problems may arise. For example, a full rack system of a 19 inch wide, or a 23 inch wide, chassis may be 6.5 feet tall. It may be impractical and/or expensive to manufacture a backplane that is larger than a standard panel size (e.g., a backplane that is 6.5 feet tall). Furthermore, it may be difficult to sufficiently cool a system of that size, as it may be difficult to obtain sufficient air flow through the system. Still further, connections on large backplanes may be sufficiently long to result in significant losses, which may negatively impact performance.

An implementation described herein may relate to a connectivity scheme and a cooling scheme for a large rack system that does not require a backplane larger than a standard panel size, that provides sufficient air flow to cool the rack system, and that includes connections that do not suffer from significant losses. A large rack system may correspond to a rack system that consumes close to a full height of a standard size rack.

A rack system may include a connectivity scheme that includes a first set of line cards connected to a second set of line cards using a common set of fabric cards. Rather than using a single, monolithic backplane, the rack system may include multiple, separate backplanes. For example, the first set of line cards may be connected to the set of fabric cards using a first backplane, and the second set of line cards may be connected to the set of fabric cards using a second backplane.

A rack system may include a cooling scheme that provides separate air flows for a first set of line cards and a second set of line cards. For example, a set of fabric cards may be located between the first set of line cards and the second set of line cards. Particular ones of the fabric cards may include a baffle that guides a first air flow in a first direction and that guides a second air flow in a second direction. For example, the baffle may guide the first air flow toward the first set of line cards and may guide the second air flow toward the second set of line cards.

A rack system architecture described herein, which includes a first set of line cards connected to a set of fabric cards using a first backplane and a second set of line cards connected to the set of fabric cards using a second backplane, may allow the use of standard size backplanes, which may be manufactured on a standard printed circuit board (PCB) panel. Furthermore, the rack system architecture described herein may include connections that remain within lengths that are comparable to those present in systems half its size, thereby leading to reduced losses and higher performance compared to a large rack system with a monolithic backplane. Still further, the rack system architecture may include a cooling system that is similar to a system with a front to back cooled standard-sized chassis, without requiring design of an expensive cooling system compared to a large rack system with a monolithic backplane. A standard-sized chassis may refer to a chassis used in systems smaller than the system described herein, such as, for example, a half rack system, or a quarter rack system.

FIG. 1 is a diagram illustrating an example rack system 100 according to an implementation described herein. In order to illustrate example components of rack system 100, FIG. 1 depicts rack system 100 as an empty chassis without any installed line cards and/or fabric cards. Rack system 100 may include a chassis frame 110, a front panel 120, a back panel 130, a backplane frame 140, and one or more backplanes. For example, rack system 100 may include a first backplane 150 and a second backplane 160.

Chassis frame 110 may provide structural stability to rack system 100 and may provide electromagnetic shielding to line cards, fabric cards, and/or control cards installed in rack system 100. Chassis frame 110 may provide attachments for front panel 120, back panel 130, and backplane frame 140 (not shown in FIG. 1).

Front panel 120 may provide a space efficient way to store and organize line cards, fabric cards, and/or control cards and may provide a way to connect cables to connectors of line cards. Front panel 120 may include a first opening 121, a first mounting area 122, a second opening 123, a second mounting area 124, a third opening 125, a third mounting area 126, and a front air intake opening 127.

First opening 121 may accommodate a first set of line cards. The first set of line cards may be fastened to front panel 120 using a first set of fasteners via first mounting area 122. For example, first mounting area 122 may include openings to accommodate fasteners (e.g., screws) that hold individual line cards in place.

Second opening 123 may accommodate a set of fabric cards and/or one or more control cards. The set of fabric cards and/or the one or more control cards may be fastened to front panel 120 using a second set of fasteners via second mounting area 124. For example, second mounting area 124 may include openings to accommodate fasteners (e.g., screws) that hold individual fabric cards or control cards in place. Furthermore, second opening 123 may allow a first air flow to enter rack system 120 via openings located in the set of fabric cards and/or the one or more control cards. The first air flow may pass through the first set of line cards.

Third opening 125 may accommodate a second set of line cards. The second set of line cards may be fastened to front panel 120 using a third set of fasteners via third mounting area 126. For example, third mounting area 126 may include openings to accommodate fasteners (e.g., screws) that hold individual line cards in place.

Front air intake opening 127 may enable a second air flow to enter rack system 100 via front panel 120. The second air flow may pass through the second set of line cards.

Back panel 130 may cover the back surface of rack system 110 and may be in a plane substantially parallel to front panel 120. Back panel 130 may include first back air exhaust opening 132 and second back air exhaust opening 134. First back air exhaust opening 132 may allow the first air flow, flowing through the first set of line cards, to exit rack system 100. Second back air exhaust opening 134 may allow the second air flow, flowing through the second set of line cards, to exit rack system 100.

Backplane frame 140 may provide structural support for one or more backplanes and may secure the one or more backplanes to chassis frame 110. For example, backplane frame 140 may secure first backplane 150 and second backplane 160 in position within chassis frame 110 in a position substantially parallel to front panel 120 and back panel 130.

First backplane 150 may include a first set of connectors 152 and a second set of connectors 154. First set of connectors 152 may include connections to particular ones of the first set of line cards. Second set of connectors 154 may include connections to particular ones of the set of fabric cards and/or the one or more control cards.

Second backplane 160 may include a first set of connectors 162 and a second set of connectors 164. First set of connectors 152 may include connections to particular ones of the set of fabric cards and/or the one or more control cards. Thus, first backplane 150 may interconnect the first set of line cards with the set of fabric cards and/or the one or more control cards. Second set of connectors 154 may include connections to particular ones of the second set of line cards. Thus, second backplane 160 may interconnect the second set of line cards with the set of fabric cards and/or the one or more control cards.

Rack system 100 may include additional openings and/or mounting areas which are not shown in FIG. 1 for the sake of clarity. For example, front panel 120 may include openings and/or mounting areas for one or more fan trays and/or one or more air filters. As another example, back panel 130 may include openings and/or mounting areas for one or more power supplies and/or one or more cable boxes for storing cables.

Figure 2:
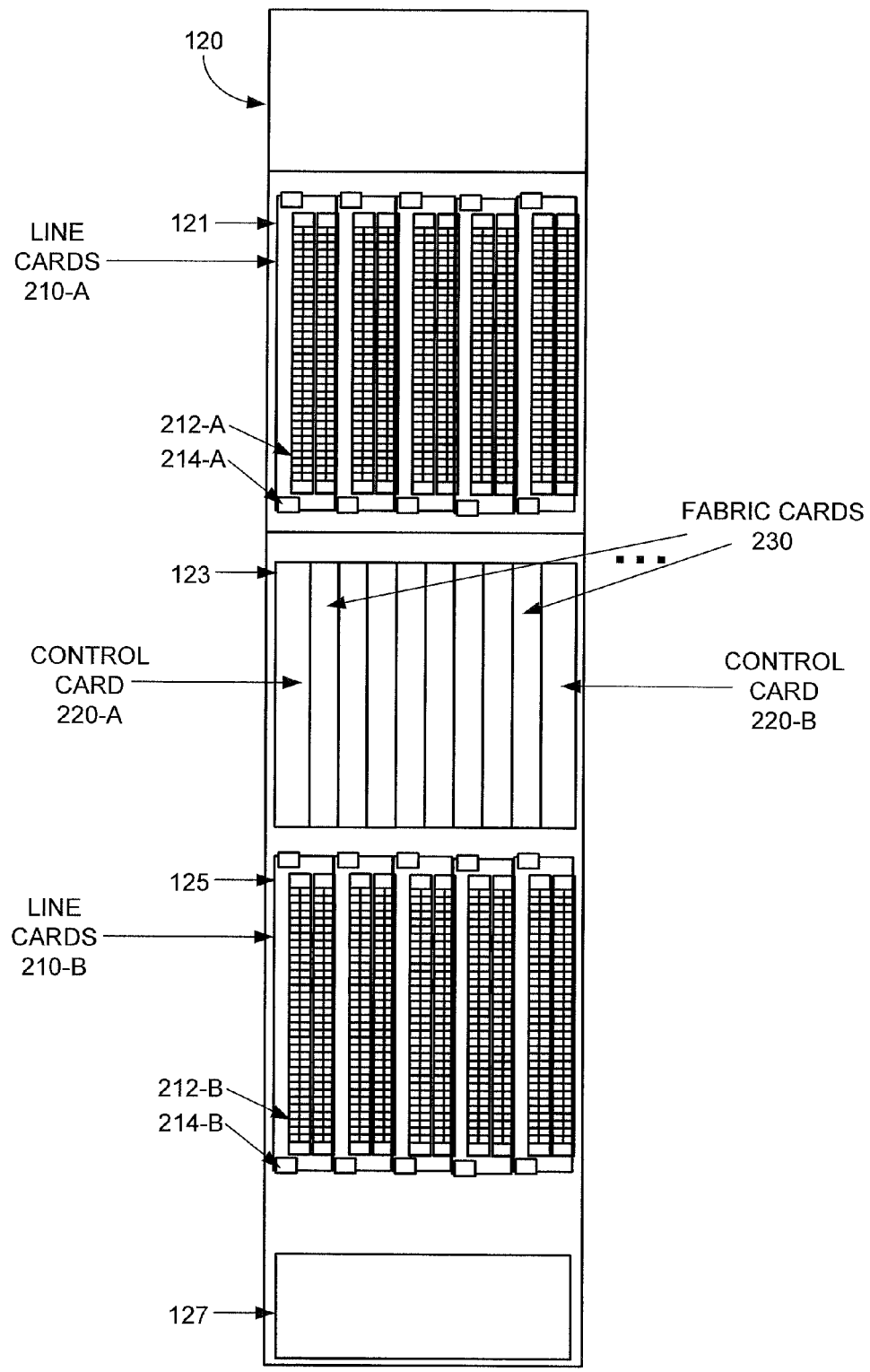
FIG. 2 is a diagram illustrating example components of front panel of the rack system of FIG. 1 according to an implementation described herein.

FIG. 2 is a diagram illustrating example components of front panel 120 of rack system 100 according to an implementation described herein. As shown in FIG. 2, front panel 120 may include a first set of one or more line cards 210-A (referred to herein collectively as "line cards 210-A" and individually as "line card 210-A"), a second set of one or more line cards 210-B (referred to herein collectively as "line cards 210-B" and individually as "line card 210-B"), one or more control cards 220 (referred to herein collectively as "control cards 220" and individually as "control card 220"), and one or more fabric cards 230 (referred to herein collectively as "fabric cards 230" and individually as "fabric card 230").

The first set of line cards 210-A may be mounted inside rack system 120 through first opening 121. Line card 210-A may include, for example, a programmable interface card that may implement one or more interfaces for a network device (e.g., a network device corresponding to some or all of rack system 100). For example, line card 210-A may include a packet forwarding engine. Line card 210-A may include line card connectors 212-A and fasteners 214-A. Connectors 212-A may correspond to front ports of line card 210-A. Line card 210-A may be mounted to front panel 120 using fasteners 214-A via first mounting area 122.

The second set of line cards 210-B may be mounted inside rack system 120 through third opening 125. Line card 210-B may include, for example, a programmable interface card that may implement one or more interfaces for a network device (e.g., a network device corresponding to some or all of rack system 100). For example, line card 210-B may include a packet forwarding engine. Line card 210-B may include line card connectors 212-B and fasteners 214-B. Connectors 212-B may correspond to front ports of line card 210-B. Line card 210-B may be mounted to front panel 120 using fasteners 214-B via first mounting area 126.

Control card 220 may include a control card that may implement control and/or management functions for a network device (e.g., a network device corresponding to some or all of rack system 100). For example, control card 220 may include a routing engine and/or a network device manager.

Fabric card 230 may include a switching mechanism. For example, fabric card 230 may include one or more switching planes to facilitate communication between line cards 210-A and/or line cards 210-B. In one implementation, each of the switching planes may include a single or multi-stage switch of crossbar elements. In another implementation, each of the switching planes may include some other form(s) of switching elements. Additionally or alternatively, the switching mechanism may include one or more processors, one or more memories, and/or one or more paths that permit communication between line cards 210-A and/or line cards 210-B.

Line cards 210-A, control cards 220, fabric cards 230, and/or line cards 210-B may be vertically mounted in rack system 100 and may be of a size that, when horizontally mounted in a chassis frame, may fit into a standard size rack (e.g., a rack that is 19 inches or 23 inches wide). Thus, rack system 100 may be over 6 feet tall.

Although FIG. 2 shows example components of front panel 120, in other implementations, front panel 120 may include fewer components, different components, differently arranged components, or additional components than depicted in FIG. 2. Additionally or alternatively, one or more components of front panel 120 may perform the tasks described as being performed by one or more other components of front panel 120.

Figure 3:
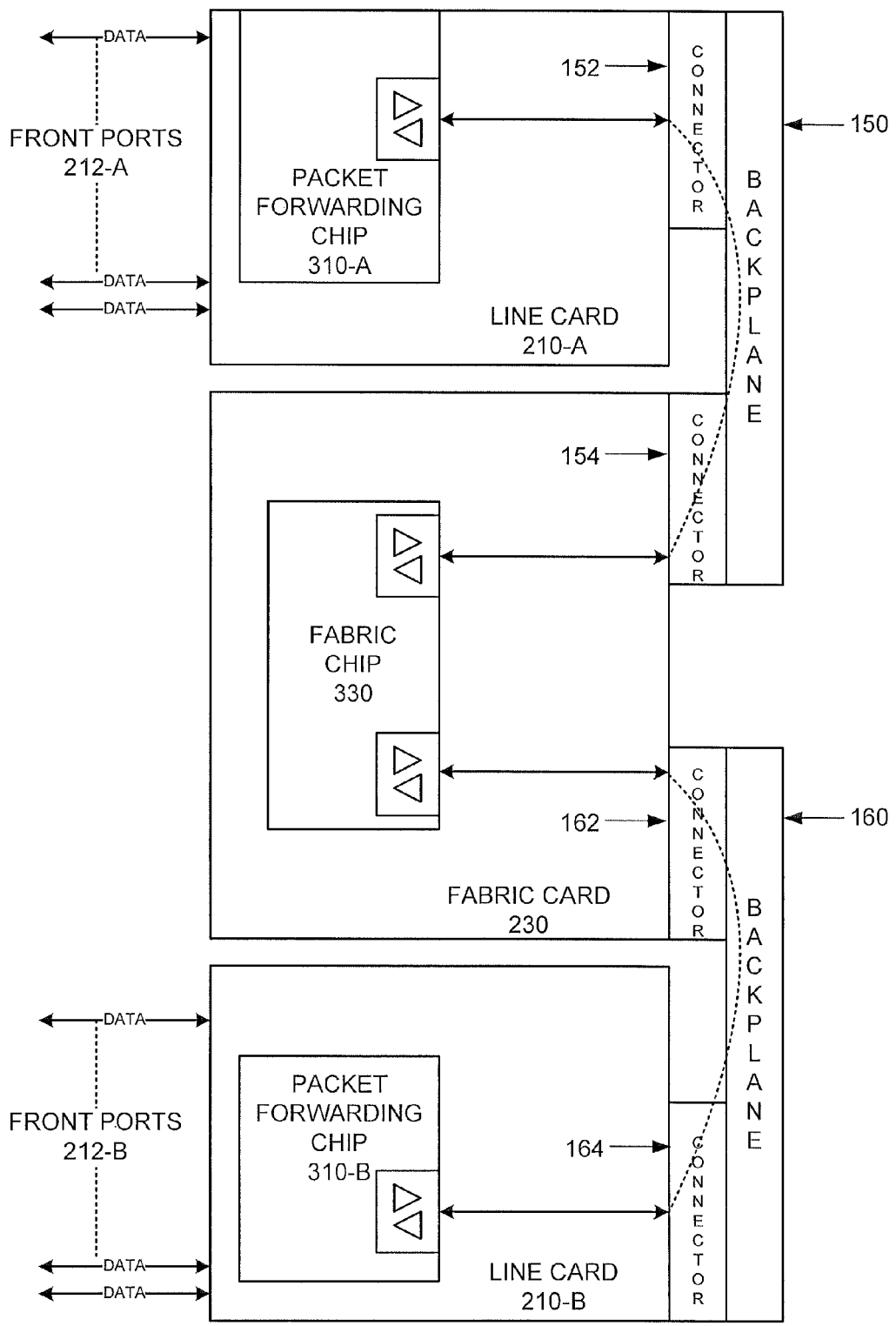
FIG. 3 is a diagram illustrating an example connectivity scheme via a side view of the rack system of FIG. 1 according to a first implementation described herein.

FIG. 3 is a diagram illustrating an example connectivity scheme of rack system 100 according to a first implementation described herein. FIG. 3 depicts a side view of rack system 100. As shown in FIG. 3, line card 210-A may include a packet forwarding chip 310-A, fabric card 230 may include a fabric chip 330, and line card 210-B may include a packet forwarding chip 310-B.

A data unit may be received via a front port corresponding to one of connectors 212-A of line card 210-A. A "data unit" may refer to a packet, a datagram, or a cell; a fragment of a packet, a fragment of a datagram, or a fragment of a cell; or another type, arrangement, or packaging of data. The data unit may be received by packet forwarding chip 310-A. Packet forwarding chip 310-A may determine a destination address for the data unit by examining a header of the data unit and may determine an output port for the data unit. The output port may correspond to a particular one of first connectors 152 of first backplane 150. Packet forwarding chip 310-A may forward the received data unit to the particular one of the first set of connectors 152. The particular one of the first set of connectors 152 may interconnect with a particular one of the second set of connectors 154 of first backplane 150.

The particular one of the second set of connectors 154 of first backplane 150 may connect to fabric chip 330 on a particular fabric card 230. Fabric chip 330 may interconnect the particular one of the second set of connectors 154 with a particular one of the first set of connectors 162 of second backplane 160. The particular one of the first set of connectors 162 may interconnect with a particular one of the second set of connectors 164 of second backplane 160.

The particular one of the second set of connectors 164 of second backplane 160 may connect to a particular line card 210-B. Thus, the data unit may be received by packet forwarding chip 310-B of the particular line card 210-B. Packet forwarding chip 310-A may determine a destination address for the data unit by examining a header of the data unit and may determine an output port for the data unit. The output port may correspond to a particular one of connectors 212-B. Thus, the data unit may be forwarded to a remote interface via a front port corresponding to the particular one of connectors 212-B.

Figure 4:
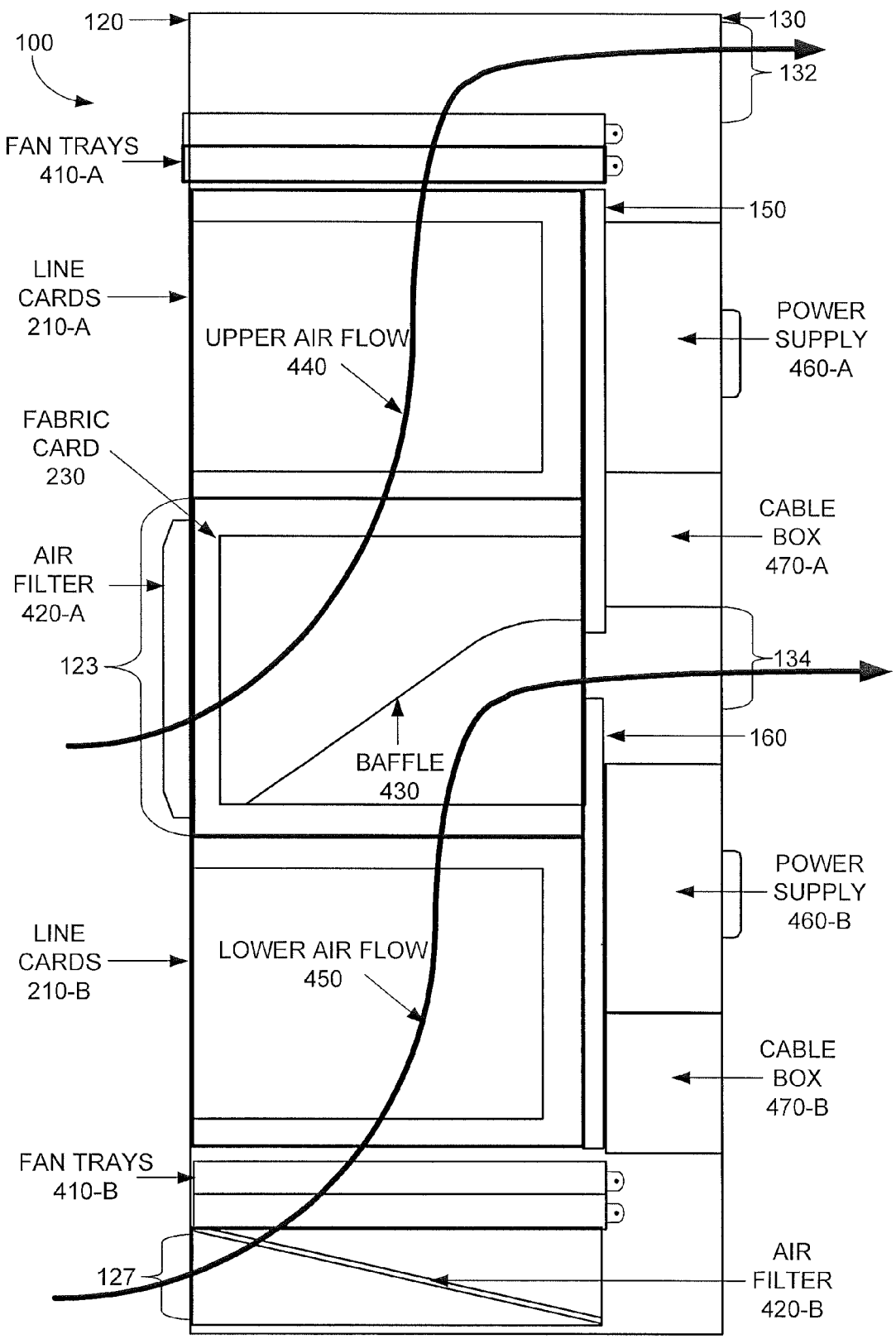
FIG. 4 is a diagram illustrating an example cooling scheme via a side view of the rack system of FIG. 1 according to a first implementation described herein.

FIG. 4 is a diagram illustrating an example cooling scheme of rack system of 100 according to a first implementation described herein. FIG. 4 depicts a side view of rack system 100. As shown in FIG. 4, rack system 100 may include first backplane 150, second backplane 160, a first set of line cards 210-A, a set of fabric cards 230 (and/or one or more control cards 220, which are not shown in FIG. 4), a second set of line cards 210-B, a set of fan trays 410-A, an air filter 420-A, a power supply 460-A, a cable box 470-A, a set of fan trays 410-B, an air filter 420-B, a power supply 460-B, and a cable box 470-B.

Fabric card 230 (and/or control card 220) may include baffle 430. Baffle 430 may be part of a frame of fabric card 230 (and/or control card 220) and may divide air flow across fabric card 230 (and/or control card 220) into an upper air flow 440 and a lower air flow 450.

Fan trays 410-A may include one or more trays that each include a set of exhaust air fans. The exhaust air fans may pull air in through second opening 123 of front panel 120, through upper portions of fabric cards 230 (and/or control cards 220), through the first set of line cards 210-A, through fan trays 410-A, and out through first back air exhaust opening 132. Thus, fan trays 410-A may help generate upper air flow 440 through upper half of rack system 100. Air filter 420-A may prevent air-borne dust particles and other contaminants from entering rack system 100 via second opening 123.

Power supply 460-A may supply power to the first set of line cards 210-A, to first backplane 150, control cards 220 and/or fabric cards 230. Cable box 470-A may store cables associated with power supply 460-A.

Fan trays 410-B may include one or more trays that each includes a set of intake air fans. The intake air fans may push air from front air intake opening 127 up through the second set of line cards 210-B, through lower portions of fabric cards 230 (and/or control cards 220), between first backplane 150 and second backplane 160, and out through second back air exhaust opening 134. Thus, fan trays 410-B may help generate lower air flow 450 through lower half of rack system 100. Air filter 420-B may prevent air-borne dust particles and other contaminants from entering rack system 100 via air intake opening 127.

Power supply 460-B may supply power to the second set of line cards 210-B, to second backplane 160, control cards 220 and/or fabric cards 230. Cable box 470-B may store cables associated with power supply 460-B.

Although FIGS. 1-4 shows example components of rack system 100, in other implementations, rack system 100 may include fewer components, different components, differently arranged components, or additional components than depicted in FIGS. 1-4. Additionally or alternatively, one or more components of rack system 100 may perform the tasks described as being performed by one or more other components of rack system 100.

For example, while FIGS. 1-4 depict rack system 100 as including two backplanes, two sets of line cards, and one set of fabric cards, in another example, rack system 100 may include additional backplanes, sets of line cards, and sets of fabric cards. For example, in another example, rack system 100 may include a first backplane that connects a first set of line cards to a first set of fabric cards, a second back plane that connects the first set of fabric cards to a second set of line cards, a third backplane that connects the second set of line cards to a second set of fabric cards, and a fourth backplane that connects the second set of fabric cards to a third set of line cards. In general, rack system 100 may be expanded to include n sets of line cards, n−1 sets of fabric cards, and 2n−2 backplanes. As another example, while FIG. 4 describes the air flow of rack system 100 as being directed from front to back, in another example, the air flow may be reversed (e.g., directed from back to front).

Figure 5:
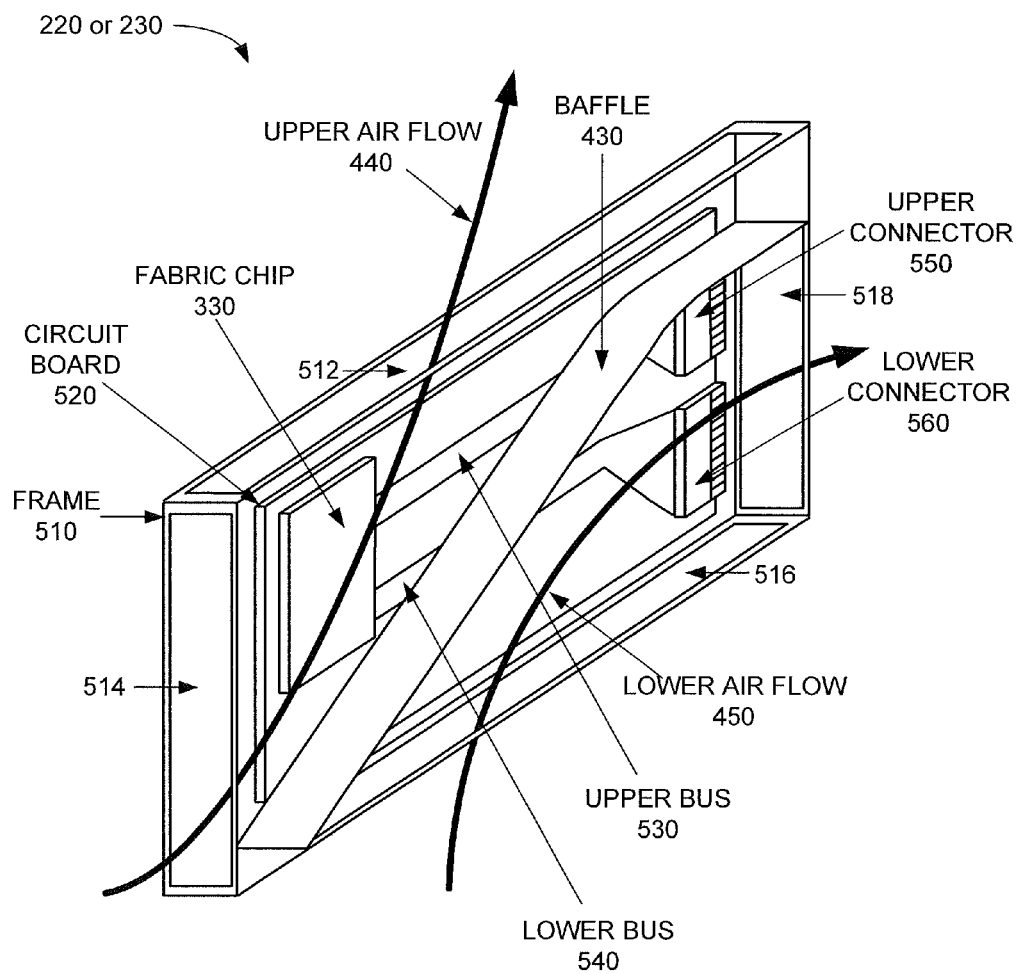
FIG. 5 is a diagram illustrating example components of a control card or a fabric card according to an implementation described herein.

FIG. 5 is a diagram illustrating example components of control card 220 or fabric card 230 according to an implementation described herein. As shown in FIG. 5, control card 220 or fabric card 230 may include a frame 510 and a circuit board 520.

Frame 510 may provide structural stability to control card 220 or fabric card 230. Frame 510 may include baffle 430, a top opening 512, a front opening 514, a bottom opening 516, and a back opening 518.

Baffle 430 may divide control card 220 or fabric card 230 into an upper portion and a lower portion. Air entering upper portion of control card 220 or fabric card 230 through front opening 514 may be directed by baffle 430 to exit through top opening 512. Air entering lower portion of control card 220 or fabric card 230 through bottom opening 516 may be directed by baffle 430 to exit through back opening 518.

While FIG. 5 depicts frame 510 as including side surface that include top opening 512, front opening 514, bottom opening 516, and back opening 518, in another example, frame 510 may not include side surface and may only include a bottom surface, to which circuit board 520 and baffle 430 are attached. Furthermore, while FIG. 5 depicts baffle 430 as being positioned diagonally from a bottom front corner of control card 220 or fabric card 230 towards a top back corner of control card 220 or fabric card 230, in another example, baffle 430 may be positioned in a different manner. For example, baffle 430 may be positioned from top front corner of control card 220 or fabric card 230 diagonally towards bottom back corner of control card 220 or fabric card 230 and may direct lower air flow 450 between front opening 514 and bottom opening 516 and may direct upper air flow 440 between top opening 512 and back opening 518.

Circuit board 520 may include a PCB that includes one or more mounted fabric chips 330, an upper bus 530, a lower bus 540, an upper connector 550, and a lower connector 560. Baffle 430 may be electrically isolated from circuit board 520. For example, there may be an air space between baffle 430 and circuit board 520 or a dielectric material may be placed between baffle 430 and circuit board 520. Upper bus 530 may connect fabric chip 330 to upper connector 550. Upper connector 550 may provide a connection to first backplane 150 (e.g., via second set of connectors 154 of first backplane 150). Lower bus 540 may connect fabric chip 330 to lower connector 560. Lower connector 560 may provide a connection to second backplane 160 (e.g., via first set of connectors 162 of second backplane 160).

Although FIG. 5 shows example components of control card 220 or fabric card 230, in other implementations, front panel 120 may include fewer components, different components, differently arranged components, or additional components than depicted in FIG. 5. Additionally or alternatively, one or more components of control card 220 or fabric card 230 may perform the tasks described as being performed by one or more other components of control card 220 or fabric card 230.

Figure 6:
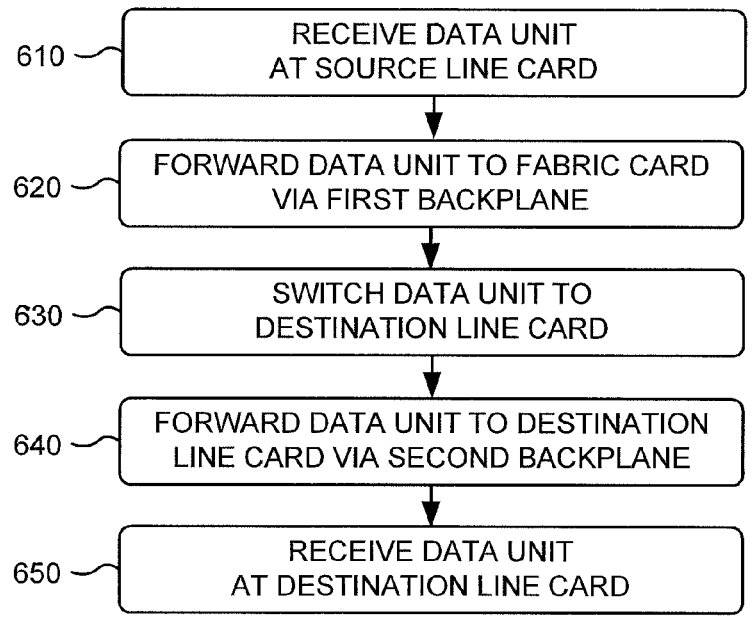
FIG. 6 is a diagram of a flow chart illustrating an example process of processing data units according to an example implementation described herein.

FIG. 6 is a diagram of a flow chart illustrating an example process of processing data units according to an example implementation described herein. In one implementation, the process of FIG. 6 may be performed by rack system 100. In other implementations, some or all of the process of FIG. 6 may be performed by another device or a group of devices separate and/or possibly remote from or including rack system 100.

The process of FIG. 6 may include receiving a data unit at a source line card (block 610). For example, line card 210-A may receive a packet through a front port via a connector 212-A. The data unit may be forwarded to a fabric card via a first backplane (block 620). For example, packet forwarding chip 310-A may forward the packet to fabric card 230 via first backplane 150.

The data unit may be switched to a destination line card (block 630). For example, fabric chip 330 of fabric card 230 may switch the packet to line card 210-B. The data unit may be forwarded to the destination line card via a second backplane (block 640). For example, fabric card 230 may forward the packet to line card 210-B via second backplane 160. The data unit may be received at the destination line card (block 650). For example, packet forwarding chip 310-B may receive the packet from fabric card 230 via second backplane 160.

Figure 7:
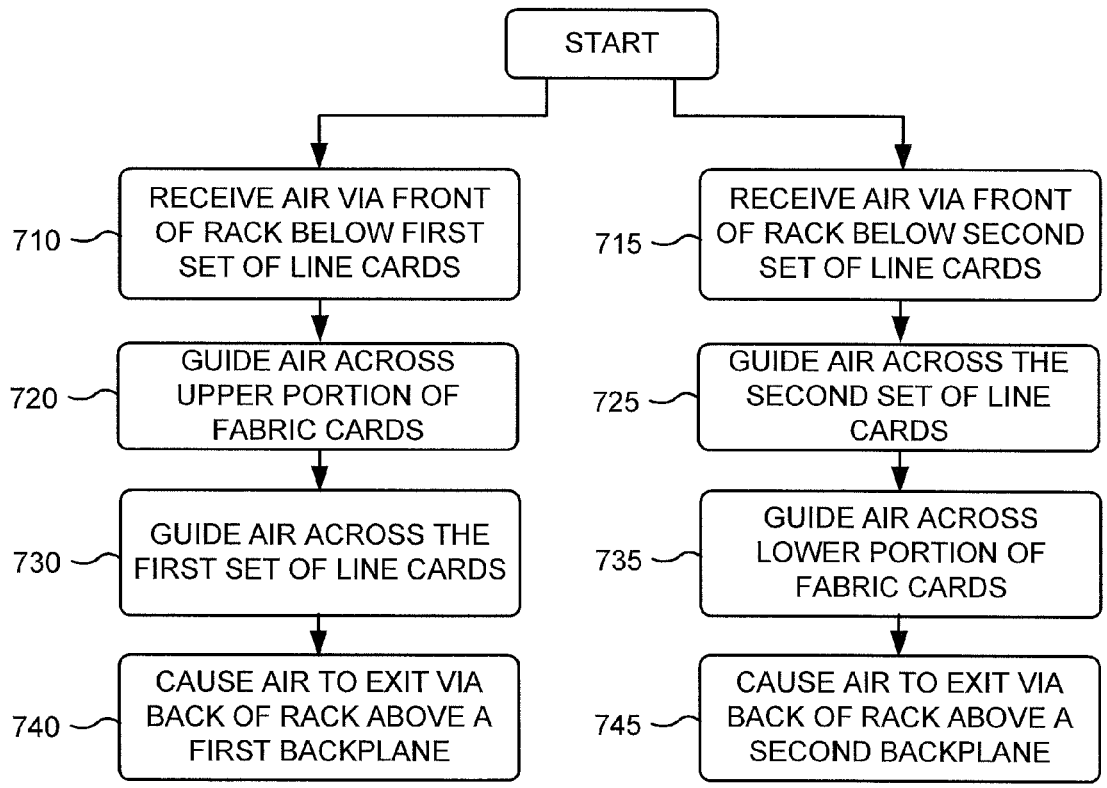
FIG. 7 is a diagram of a flow chart illustrating an example process for cooling according to an implementation describe herein.

FIG. 7 is a diagram of a flow chart illustrating an example process for cooling according to an implementation describe herein. In one implementation, the process of FIG. 7 may be performed by rack system 100. In other implementations, some or all of the process of FIG. 7 may be performed by another device or a group of devices separate and/or possibly remote from or including rack system 100.

The process of FIG. 7 may include receiving air via the front of a rack system below a first set of line cards (block 710). For example, rack system 100 may receive upper air flow 440 through front openings 514 of control cards 220 and/or fabric cards 230 installed in second opening 123 of front panel 120. Substantially simultaneously, air may be received via the front of the rack system below a second set of line cards (block 715). For example, rack system 100 may receive lower air flow 450 through front air intake opening 127 of front panel 120.

The air may be guided across an upper portion of fabric cards (and/or control cards) (block 720). For example, upper air flow 440 may be guided, via fans mounted in fan trays 410-A, across the portion of fabric cards 230 (and/or control cards 220) located above baffle 430. Substantially simultaneously, air may be guided across the second set of line cards (block 725). For example, lower air flow 450 may be guided, via fans mounted in fan trays 410-B, across the second set of line cards 210-B.

Air may be guided across the first set of line cards (block 730). For example, upper air flow 440 may continue to be guided, via fans mounted in fan trays 410-A, across the first set of line cards 210-A. Substantially simultaneously, air may be guided across a lower portion of fabric cards (and/or control cards) (block 735). For example, lower air flow 450 may be guided, via fans mounted in fan trays 410-B, across the portion of fabric cards 230 (and/or control cards 220) located below baffle 430.

The air may be caused to exit via the back of the rack system above a first backplane (block 740). For example, upper air flow 440 may be caused to exit rack system 100, via fans mounted in fan trays 410-A, above first backplane 150 and through first back air exhaust opening 132 of back panel 130. Substantially simultaneously, air may be caused to exit via a back of the rack system above a second backplane (block 745). For example, lower air flow 450 may be caused to exit rack system 100, via fans mounted in fan trays 410-B, between first backplane 150 and second backplane 160 and through second back air exhaust opening 134 of back panel 130.

CONCLUSION

The foregoing description provides illustration and description, but is not intended to be exhaustive or to limit the invention to the precise form disclosed. Modifications and variations are possible in light of the above teachings or may be acquired from practice of the invention.

While a series of blocks has been described with respect to FIGS. 6 and 7, the order of the blocks may be modified in other implementations. Further, non-dependent blocks may be performed in parallel.

Also, certain portions of the implementations may have been described as a "component" that performs one or more functions. The "component" may include hardware, such as a processor, an ASIC, or a FPGA, or a combination of hardware and software (e.g., software running on a processor).

It will be apparent that aspects, as described above, may be implemented in many different forms of software, firmware, and hardware in the implementations illustrated in the figures. The actual software code or specialized control hardware used to implement these aspects should not be construed as limiting. Thus, the operation and behavior of the aspects were described without reference to the specific software code—it being understood that software and control hardware could be designed to implement the aspects based on the description herein.

It should be emphasized that the term "comprises/comprising" when used in this specification is taken to specify the presence of stated features, integers, steps, or components, but does not preclude the presence or addition of one or more other features, integers, steps, components, or groups thereof.

Even though particular combinations of features are recited in the claims and/or disclosed in the specification, these combinations are not intended to limit the invention. In fact, many of these features may be combined in ways not specifically recited in the claims and/or disclosed in the specification.

No element, act, or instruction used in the description of the present application should be construed as critical or essential to the invention unless explicitly described as such. Also, as used herein, the article "a" is intended to include one or more items. Where only one item is intended, the term "one" or similar language is used. Further, the phrase "based on," as used herein is intended to mean "based, at least in part, on" unless explicitly stated otherwise.

What is claimed:

1. A rack system comprising:
    a first plurality of line cards,
        a particular one of the first plurality of line cards receiving or sending packets via ports;
    a second plurality of line cards,
        a particular one of the second plurality of line cards receiving or sending packets via ports;
    a plurality of fabric cards,
        a particular one of the plurality of fabric cards including a switching fabric,
        one of the plurality of fabric cards including a baffle that separates air flow across the one of the plurality of fabric cards into a first air flow and a second air flow, the baffle directing:
            the first air flow across an upper portion of the one of the plurality of fabric cards and toward the first plurality of line cards, and
            the second air flow across a lower portion of the one of the plurality of fabric cards and toward the second plurality of line cards;
    a first backplane that connects the first plurality of line cards to the plurality of fabric cards; and
    a second backplane that connects the second plurality of line cards to the plurality of fabric cards.

2. The rack system of claim 1, where the plurality of fabric cards includes one or more control cards.

3. The rack system of claim 1, where the first plurality of line cards is located above the plurality of fabric cards, and
    where the second plurality of line cards is located below the plurality of fabric cards.

4. The rack system of claim 1, where one of the first plurality of line cards, one of the plurality of fabric cards, and one of the second plurality of line cards are vertically mounted in the rack system.

5. The rack system of claim 1, where the rack system further includes an intake opening located below the second plurality of line cards, and
    where the second air flow enters through the intake opening.

6. The rack system of claim 1, where the rack system further includes a back panel, and
    where the back panel includes:
        a first exhaust opening located above the first backplane,
            where the first air flow exits the rack system through the first exhaust opening; and
        a second exhaust opening located below the first backplane,
            where the second air flow exits the rack system through the second exhaust opening.

7. The rack system of claim 1, further comprising:
    a first fan tray located above the first plurality of line cards,
        where the first fan tray includes a plurality of fans that pull the first air flow across the first plurality of line cards; and
    a second fan tray located below the second plurality of line cards,
        where the second fan tray includes a plurality of fans that push the second air flow across the second plurality of line cards.

8. The rack system of claim 1, where the first backplane includes:
    a first set of connectors to connect to the first plurality of line cards, and
    a second set of connectors to connect to the plurality of fabric cards, and
    where the second backplane includes:
        a first set of connectors to connect to the plurality of fabric cards, and
        a second set of connectors to connect to second plurality of line cards.

9. The rack system of claim 1, where one of the plurality of fabric cards includes:
    a first connector to connect the switching fabric to the first backplane, and
    a second connector to connect the switching fabric to the second backplane.

10. A fabric card comprising:
    a printed circuit board that includes a switching fabric; and
    a frame that includes a baffle,
        the baffle dividing air flow over the fabric card into a first air flow and a second air flow,
        the baffle directing:
            the first air flow across an upper portion of the fabric card and toward a first plurality of line cards associated with the fabric card, and the second air flow across a lower portion of the fabric card and toward a second plurality of line cards associated with the fabric card, and the printed circuit board being mounted onto the frame.

11. The fabric card of claim 10, where, when the fabric card is installed vertically in a chassis, the baffle extends diagonally from a bottom front corner toward a top back corner substantially across a length of the printed circuit board.

12. The fabric card of claim 10, where the printed circuit board includes:

a first connector to connect the switching fabric to a first backplane; and a second connector to connect the switching fabric to a second backplane.

13. A method comprising:

receiving a data unit by a first line card mounted in a rack system, the first line card being mounted in a first opening of a front panel of the rack system;

forwarding the data unit to a fabric card via a first backplane, the fabric card being mounted in a second opening of the front panel;

switching, by the fabric card, the data unit to a second line card via a second backplane, the second backplane being different from the first backplane, the second line card being mounted in a third opening of the front panel; and receiving the data unit by the second line card.

14. The method of claim 13, where the first opening is located above the second opening, and where the third opening is located below the second opening.

15. The method of claim 13, further comprising:

causing, using the fabric card, air flow entering the rack system to be divided into:

a first air flow that flows over the first line card, and a second air flow that flows over the second line card.

16. The method of claim 15, further comprising:

using a first plurality of fans to pull the first air flow across the first line card; and using a second plurality of fans to push the second air flow across the second line card.

17. The method of claim 15, where the air flow is divided further using a baffle that separates the fabric card diagonally into an upper portion and a lower portion, where the first air flow flows across the upper portion, and where the second air flow flows across the lower portion.

18. The fabric card of claim 10, further comprising:

a first connector to connect the switching fabric to a first connector of a first backplane of a rack system, and a second connector to connect the switching fabric to a second connector of a second backplane of the rack system.

* * * * *